United States Patent
Lee et al.

(10) Patent No.: US 7,049,232 B2
(45) Date of Patent: May 23, 2006

(54) METHODS FOR FORMING RUTHENIUM FILMS WITH β-DIKETONE CONTAINING RUTHENIUM COMPLEXES AND METHOD FOR MANUFACTURING METAL-INSULATOR-METAL CAPACITOR USING THE SAME

(75) Inventors: Kwang-hee Lee, Seoul (KR); Cha-young Yoo, Suwon (KR); Han-jin Lim, Seoul (KR); Sung-tae Kim, Seoul (KR); Suk-jin Chung, Suwon (KR); Wan-don Kim, Yongin (KR); Jung-hee Chung, Seoul (KR); Jin-il Lee, Sungnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 105 days.

(21) Appl. No.: 10/657,596

(22) Filed: Sep. 8, 2003

(65) Prior Publication Data

US 2004/0166671 A1    Aug. 26, 2004

(30) Foreign Application Priority Data

Feb. 26, 2003    (KR) .................. 10-2003-0012044

(51) Int. Cl.
 *H01L 21/44* (2006.01)
(52) U.S. Cl. ........................ 438/680; 438/686
(58) Field of Classification Search ............. 438/680, 438/681, 686; 427/132, 255.31
See application file for complete search history.

(56) References Cited

U.S. PATENT DOCUMENTS

| | | | | |
|---|---|---|---|---|
| 5,980,983 A | * | 11/1999 | Gordon | 427/226 |
| 6,238,734 B1 | * | 5/2001 | Senzaki et al. | 427/226 |
| 6,303,809 B1 | * | 10/2001 | Chi et al. | 556/136 |
| 2003/0203102 A1 | * | 10/2003 | Saito et al. | 427/132 |
| 2004/0214392 A1 | * | 10/2004 | Nabatame et al. | 438/253 |

FOREIGN PATENT DOCUMENTS

| | | |
|---|---|---|
| KR | 1020010023994 | 5/2001 |
| KR | 1020010023995 | 5/2001 |
| KR | 1020030023681 | 10/2003 |

OTHER PUBLICATIONS

Notice of Office Action corresponding to Korean Application No. 10-2003-0012044, dated Jan. 25, 2005.

* cited by examiner

*Primary Examiner*—Tuan H. Nguyen
(74) *Attorney, Agent, or Firm*—Myers Bigel Sibley & Sajovec, PA

(57) ABSTRACT

Provided are 1) a method for forming a ruthenium film under a single process condition, whereby high adhesion of the ruthenium film to a lower layer is maintained, and 2) a method for manufacturing an metal-insulator-metal (MIM) capacitor using the ruthenium film forming method. The method for forming a ruthenium film includes supplying bis(isoheptane-2,4-dionato)norbornadiene ruthenium at a flow rate of 0.2–1 ccm and oxygen at a flow rate of 20–60 sccm, and depositing the ruthenium film at a temperature of 330–430° C. under a pressure of 0.5–5 Torr using chemical vapor deposition (CVD).

26 Claims, 12 Drawing Sheets

METHODS FOR FORMING RUTHENIUM FILMS WITH β-DIKETONE CONTAINING RUTHENIUM COMPLEXES AND METHOD FOR MANUFACTURING METAL-INSULATOR-METAL CAPACITOR USING THE SAME

BACKGROUND OF THE INVENTION

This U.S. non-provisional application claims priority under 35 U.S.C. §119 to Korean Patent Application No. 2003-12044, filed on Feb. 26, 2003, in the Korean Intellectual Property Office, the contents of which are incorporated herein by reference in its entirety.

1. Field of the Invention

The present invention relates to film formation in the manufacturing of metal-insulator-metal (MIM) capacitors.

2. Description of the Related Art

Recently, due to their excellent electrical properties (such as resistivity), ruthenium and ruthenium compounds are being used as thin film electrode materials in the production of semiconductor devices for Dynamic Random Access Memory (DRAM) and Ferroelectric Random Access Memory (FeRAM).

Ruthenium or ruthenium compound films are usually formed by sputtering or chemical vapor deposition (CVD) methods. In particular, CVD is preferred since thin layers with uniform thickness are easily formed.

In order to form ruthenium films using CVD, a ruthenium source is required. Currently, bis(ethylcyclopentadienyl)ruthenium [Ru(EtCp)$_2$], as shown in FIG. 1, is the most common ruthenium source. Such an organic ruthenium compound is obtained by replacing one hydrogen on each of two cyclopentadiene rings of bis(cyclopentadienyl)ruthenium with an ethyl group. Because the bis(ethylcyclopentadienyl)ruthenium has a low melting point, it is a liquid at room temperature. Therefore, bis(ethylcyclopentadienyl)ruthenium possesses good handling properties.

However, the bis(ethylcyclopentadienyl)ruthenium has problems in its use as a material for ruthenium films. The main problem is that it is difficult to carry out the nucleation of the bis(ethylcyclopentadienyl)ruthenium. In order to solve this problem, ruthenium films are generally formed under increased oxygen flow rate and deposition pressure. However, if the oxygen flow rate and the deposition pressure are increased, the nucleation rate per unit area is excessively increased. As a result, ruthenium films form in a needle shape. Formation of such needle-shaped ruthenium films results in surface morphology, increase of a sheet resistance, and generation of a leakage current. On the other hand, if ruthenium films are formed under decreased deposition pressure and oxygen flow rate, the nucleation rate is excessively lowered. As a result, ruthenium grains are separated from each other.

Due to this problem, when bis(ethylcyclopentadienyl)ruthenium is used as the ruthenium source for forming films, ruthenium films may sometimes be formed using a method comprising (a) carrying out nucleation of the bis(ethylcyclopentadienyl)ruthenium under increased oxygen flow rate and deposition pressure and (b) depositing the ruthenium films under decreased oxygen rate and deposition pressure. In this case, however, due to the different process conditions used, the process burden is increased. In addition, if the two steps are carried out in-situ, the process conditions become unstable during the transitional stage between the two steps. As a result, the reproducibility and reliability of the process are lowered. On the other hand, if the two steps are carried out in two separate chambers, a residue may be left on the surface of a wafer when the wafer is transferred from one chamber to the other. In addition, when a gas for cooling the wafer is introduced into a chamber, the wafer is often displaced due to the change in pressure. As a result, the ruthenium films on the wafer do not have uniform thickness.

Meanwhile, the bis(ethylcyclopentadienyl)ruthenium has another problem in that ruthenium films made of bis(ethylcyclopentadienyl)ruthenium have relatively low adhesion to silicon dioxide films which are commonly used as interlayer insulating layers.

SUMMARY OF THE INVENTION

The present invention provides a method for forming a ruthenium film under a single process condition, whereby high adhesion of the ruthenium film to a lower layer is maintained.

The present invention also provides a method for manufacturing a metal-insulator-metal (MIM) capacitor using the ruthenium film formation method.

The present invention discloses a method for forming a ruthenium film, the method comprising supplying a two β-diketones-coordinated ruthenium organic matter as a ruthenium source and oxygen onto a substrate and depositing the ruthenium film using chemical vapor deposition (CVD).

According to one embodiment of the present invention, there is provided a method for forming a ruthenium film, the method comprising supplying a bis-β-diketones-coordinated ruthenium complex as the ruthenium source at a flow rate of 0.2 to 0.1 ccm, and oxygen at a flow rate of 20 to 60 sccm onto a substrate and depositing the ruthenium film using CVD.

According to one preferred embodiment of the present invention, the ruthenium source is a two β-diketones and one diene-coordinated ruthenium complex, as represented by the general formula 1:

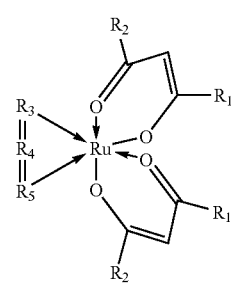

Formula 1 wherein $R_1$ and $R_2$ are alkyl groups; the total carbon number of $R_1$ and $R_2$ is 3 to 5; and $R_3$, $R_4$ and $R_5$ are interconnected to each other to form a chain.

The diene is preferably 1,4-cyclohexadiene, norbornadiene, or 1,5-cyclooctadiene. Preferably, $R_1$ and $R_2$ are asymmetric.

In another embodiment, the ruthenium source is a two β-diketones and one diamine-coordinated ruthenium complex, as represented by the general formula 2:

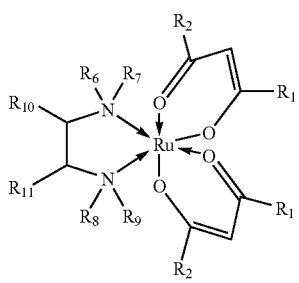

Formula 2 wherein $R_1$ and $R_2$ are alkyl groups; the total carbon number of $R_1$ and $R_2$ is 3 to 5; $R_6$, $R_7$, $R_8$, $R_9$, $R_{10}$ and $R_{11}$ are independently hydrogen or alkyl groups; and the total carbon number of $R_6$, $R_7$, $R_8$, $R_9$, $R_{10}$ and $R_{11}$ is 2 to 8.

The diamine is preferably N,N,N',N'-tetramethylethylenediamine. Preferably, $R_1$ and $R_2$ are asymmetric.

In another embodiment, the ruthenium source is a two β-diketones and two organic ligands-coordinated ruthenium complex, as represented by the general formula 3:

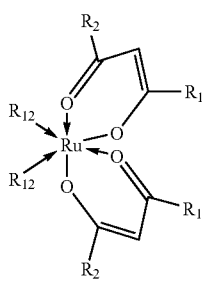

Formula 3 wherein $R_1$ and $R_2$ are alkyl groups; the total carbon number of $R_1$ and $R_2$ is 2 to 5; and two $R_{12}$ groups are olefin, amine, nitrile or carbonyl.

As used as the organic ligand, the olefin is preferably ethylene, propylene, 2-methylpropylene, butyl, or 1,3-butadiene; the amine is preferably trimethylamine or triethylamine; and the nitirile is preferably acetonitrile or acrylonitrile. The two β-diketones are preferably 2,4-hexanedione, 5-methyl-2,4-hexanedione, 2,4-heptanedione, 5-methyl-2,4-heptanedione, 6-methyl-2,4-heptanedione, or 2,4-octanedione.

The ruthenium source is preferably bis(isoheptane-2,4-dinato)norbornadiene ruthenium.

The ruthenium film is deposited at a temperature of 330–430° C. under a pressure of 0.5–5 Torr. When the ruthenium film is deposited, an inert gas such as nitrogen or argon is supplied onto the substrate.

According to another embodiment of the present invention, there is provided a method for forming a ruthenium film, the method supplying bis(isoheptane-2,4-dionato)norbornadiene ruthenium as the ruthenium source at a flow rate of 0.2 to 1 ccm and oxygen at a flow rate of 20 to 60 sccm onto a substrate and depositing the ruthenium film using CVD at a temperature of 330–430° C. under a pressure of 0.5–5 Torr.

According to yet another aspect of the present invention, there is provided a method for manufacturing an MIM capacitor, the method comprising (a) forming a first ruthenium film for a lower electrode on a semiconductor substrate; (b) forming a dielectric layer on the lower electrode; and (c) forming a second ruthenium film for an upper electrode on the dielectric layer. Step (a) comprises supplying a two β-diketones-coordinated ruthenium complex as the ruthenium source at a flow rate of 0.2–1 ccm and oxygen at a flow rate of 20–60 sccm onto the substrate and depositing the first ruthenium film using CVD. Step (c) comprises supplying a two β-diketones-coordinated ruthenium complex as a ruthenium source at a flow rate of 0.2–1 ccm and oxygen at a flow rate of 20–60 sccm onto the substrate and depositing the second ruthenium film using CVD.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described with reference to the accompanying drawings. However, the present invention is not limited to these embodiments and various modifications can be carried out. The embodiments of the present invention are provided to assist ordinary persons skilled in the art to more clearly understand the present invention. In this regard, each constitutional element on drawings is graphically expressed for proper understanding. The same numerals are used for the corresponding constitutional elements in drawings. As used herein, the expression "a first layer is formed 'on' a second layer or a semiconductor substrate" includes the case where the first layer indirectly contacts with the second layer due to a third layer between the first layer and the second layer, in addition to direct contact of the first layer and the second layer.

Figure 1:
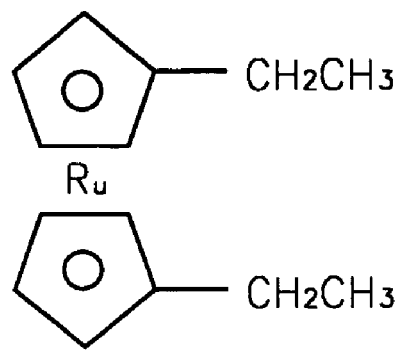
FIG. 1 is a general formula of a conventional ruthenium source for forming ruthenium films.
Figure 2:
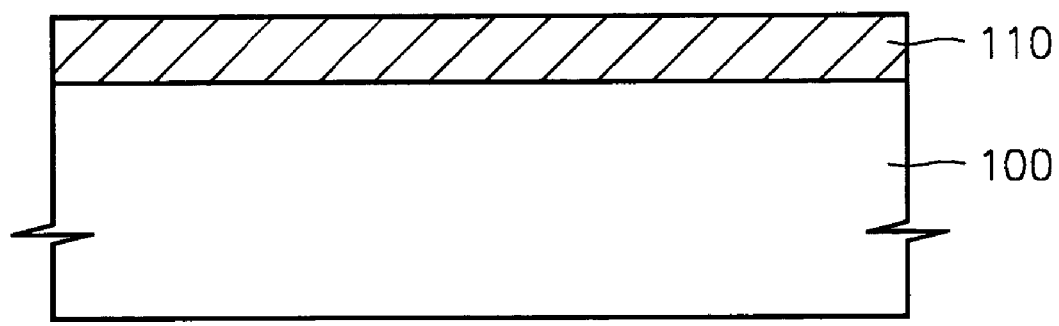
FIG. 2 is a cross sectional view of a ruthenium film formed on a semiconductor substrate according to the present invention.

Referring to FIG. 2, first, a semiconductor substrate 100 is placed in a chamber. The substrate 100 may be a silicon substrate. An MOS transistor (not shown) and an interlayer insulating layer (not shown) may be formed on the substrate. Although not clearly shown in FIG. 2, a silicon dioxide film as an interlayer insulating layer is formed on the uppermost surface of the substrate 100. In accordance with the present invention, a ruthenium film 110 is formed on the substrate 100 from a ruthenium source of the present invention using chemical vapor deposition (CVD).

Figure 3:
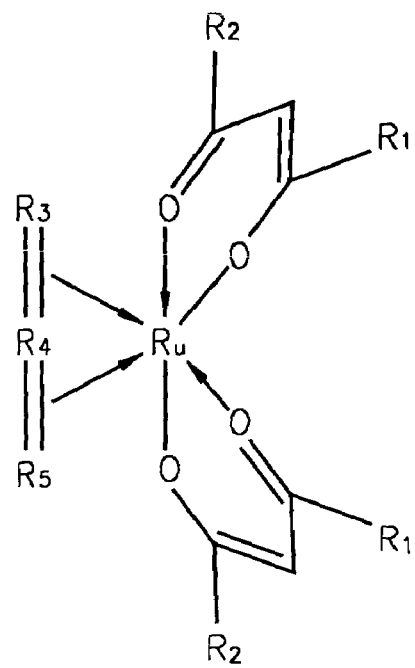
FIGS. 3 to 5 are formulas of ruthenium sources for forming ruthenium films according to embodiments of the present invention.

In one embodiment of the present invention, a ruthenium source for forming the ruthenium film 10 is a two β-diketones and one diene-coordinated ruthenium complex (see FIG. 3). $R_1$ and $R_2$ as substituents of each β-diketone may be alkyl groups. The total carbon number of $R_1$ and $R_2$ is 3 to 5. Preferably, $R_1$ and $R_2$ may be asymmetric. The diene may be 1,4-cyclohexadiene, norbornadiene or 1,5-cyclooctadiene.

Figure 4:
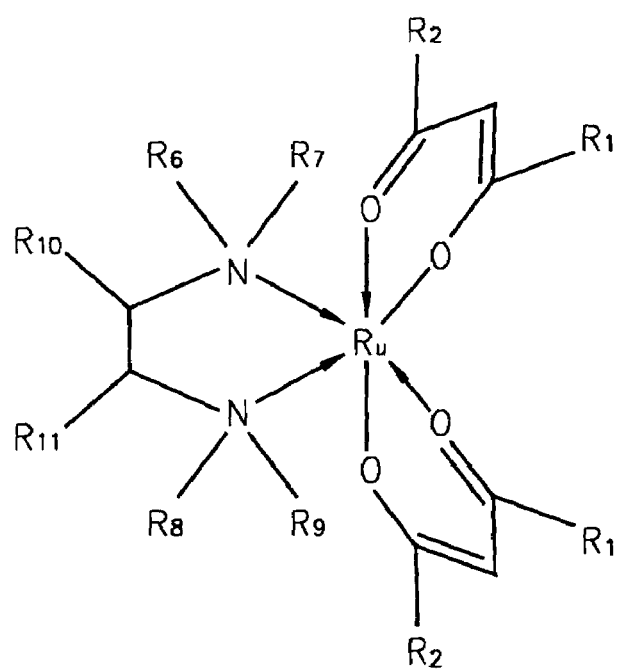

In another embodiment of the present invention, a ruthenium source for forming the ruthenium film 110 is a two β-diketones and one diamine-coordinated ruthenium complex (see FIG. 4). $R_1$ and $R_2$ as substituents of each β-diketone may be alkyl groups. The total carbon number of $R_1$ and $R_2$ may be 2 to 5. Preferably, $R_1$ and $R_2$ may be asymmetric. The two β-diketones may be 2,4-hexanedione, 5-methyl-2,4-hexanedione, 2,4-heptanedione, 5-methyl-2,4-heptanedione, 6-methyl-2,4-heptanedione, or 2,4-octanedione. $R_6$, $R_7$, $R_8$, $R_9$, $R_{10}$ and $R_{11}$ as substituents of the diamine are independently hydrogen or alkyl groups. Total carbon number of these substituents may be 2 to 8. The diamine may be N,N,N',N'-tetramethylethylenediamine.

Figure 5:
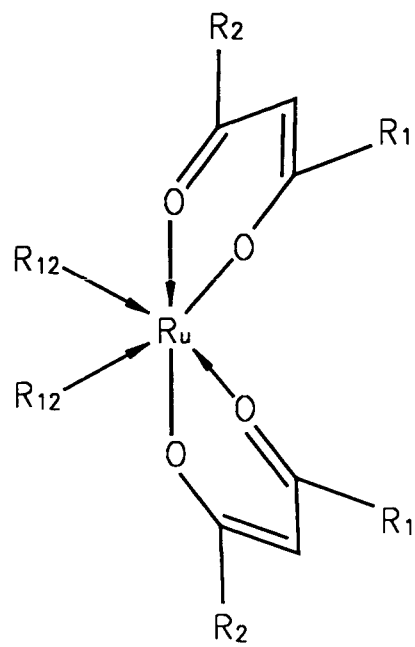

In yet another embodiment of the present invention, a ruthenium source for forming the ruthenium film 110 is a two β-diketones and two organic ligands—coordinated ruthenium complex (see FIG. 5). $R_1$ and $R_2$ as substituents of each β-diketone may be alkyl groups. The total carbon number of $R_1$ and $R_2$ may be 2 to 5. Two $R_{12}$ groups as the organic ligands are olefin, amine, nitrile or carbonyl. As used as the organic ligand, the olefin may be ethylene, propylene, 2-methylpropylene, butyl, or 1,3-butadiene; the amine may be trimethylamine or triethylamine; and the nitirile may be acetonitrile or acrylonitrile.

Hereinafter, optimal process condition for forming a ruthenium film will be described using bis(isoheptane-2,4-dionato)norbornadiene ruthenium $[Ru(C_7H_8)(C_7H_{11}O_2)_2$, simply referred to as "bis norbornadiene ruthenium", hereinafter] as a ruthenium source.

Figure 6:
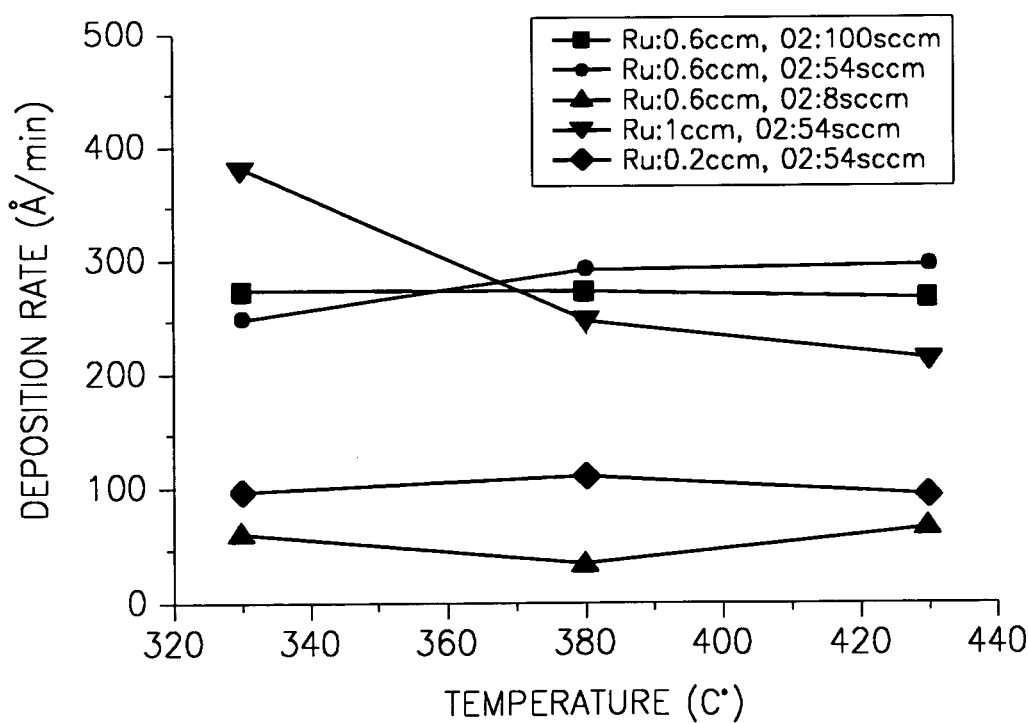
FIG. 6 is a graph showing variation in a deposition rate with temperature using a ruthenium source according to the present invention.

In order to determine a relationship between the deposition rate and temperature, the deposition rate of a ruthenium film was measured as a function of temperature (330–440° C.) while varying the ruthenium source flow rate (0.2–1 ccm) and oxygen flow rate (8–100 sccm). As shown in FIG. 6, the deposition rate showed little change over the temperature range when the ruthenium source flow rate and oxygen flow rate was held constant.

Figure 7:
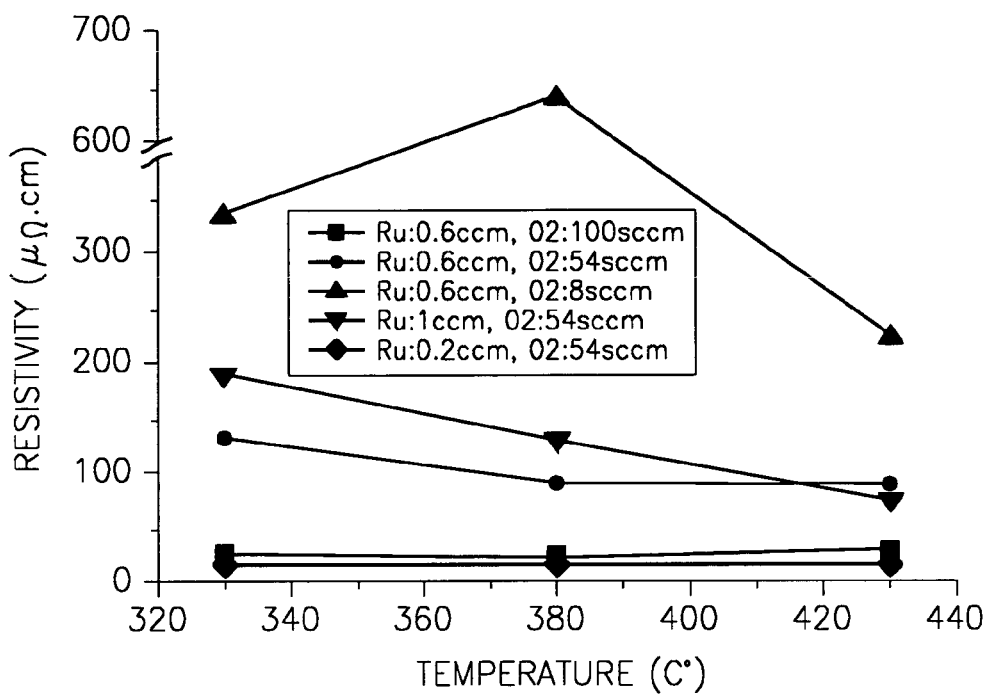
FIG. 7 is a graph showing variation in resistivity with temperature using a ruthenium source according to the present invention.

Under the same variable values as mentioned above, the resistivity was measured as a function of temperature while varying the ruthenium source flow rate and the oxygen flow rate. As shown in FIG. 7, it can be seen that resistivity does not depend on temperature when the ruthenium source flow rate and oxygen flow rate are constant.

Figure 8:
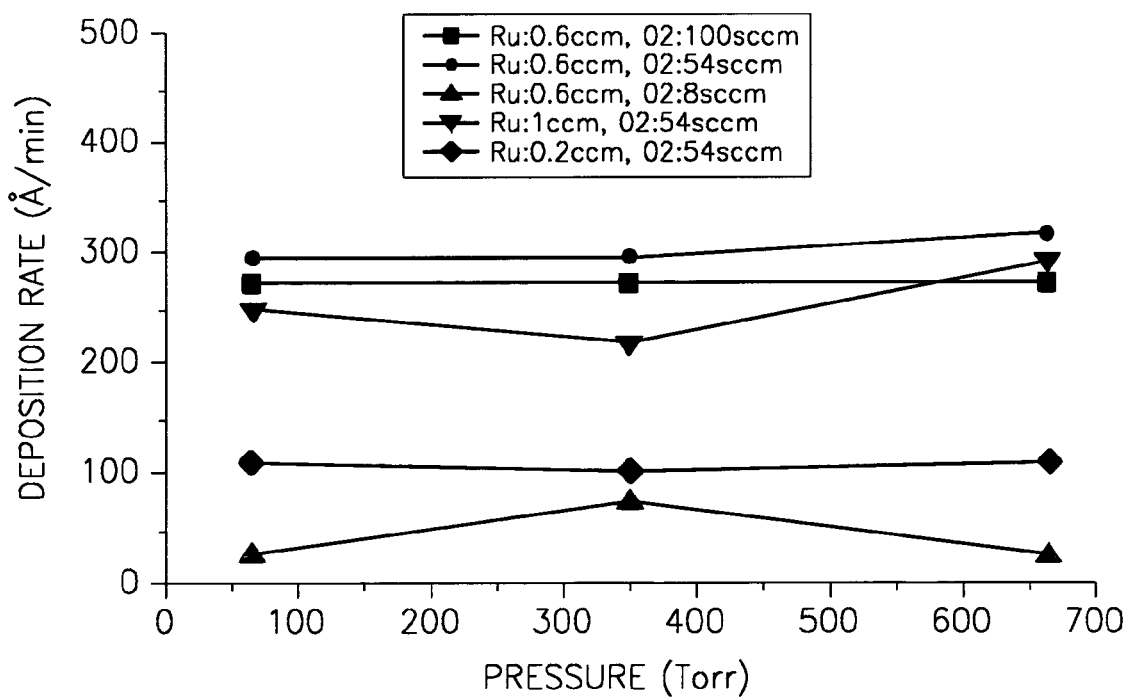
FIG. 8 is a graph showing variation in deposition rate with pressure using a ruthenium source according to the present invention.

In order to determine a relationship between the deposition rate and pressure, the deposition rate of a ruthenium film as a function of pressure (100–700 Torr) was measured while varying the ruthenium source flow rate (0.2–1 ccm) and the oxygen flow rate (8–100 sccm). As shown in FIG. 8, the deposition rate showed little change over the pressure range. Rather, the deposition rate varied with the ruthenium source flow rate and the oxygen flow rate.

Figure 9:
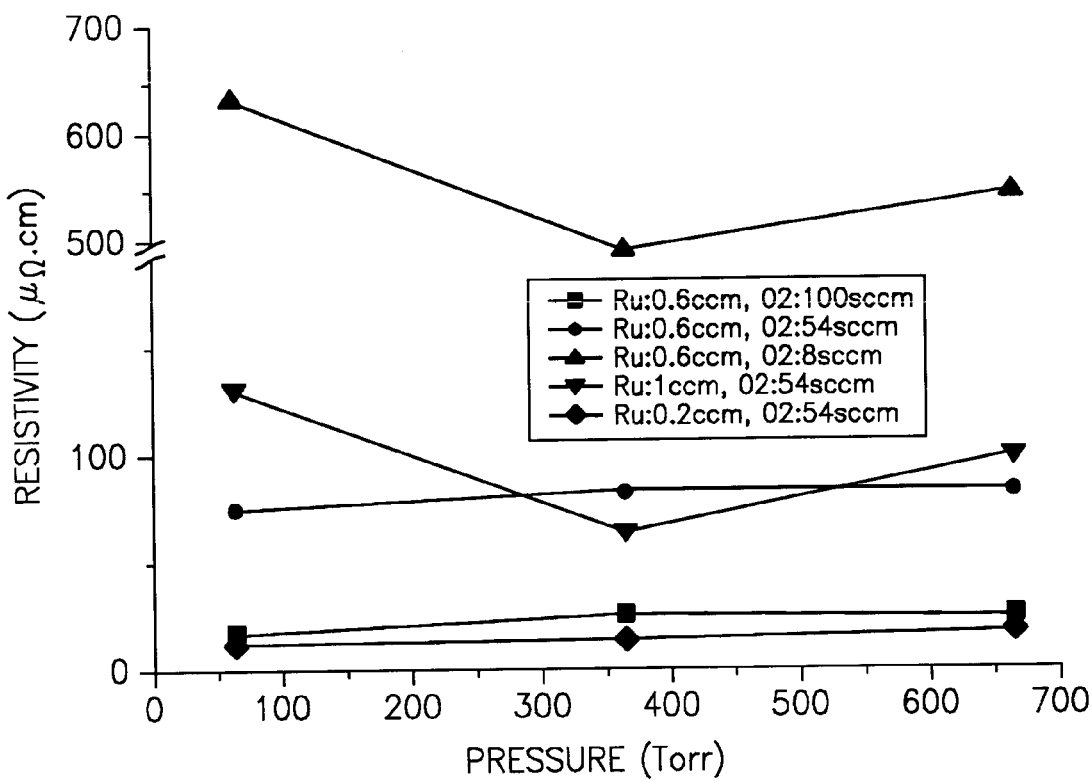
FIG. 9 is a graph showing variation in resistivity with pressure using a ruthenium source according to the present invention.
Figure 10:
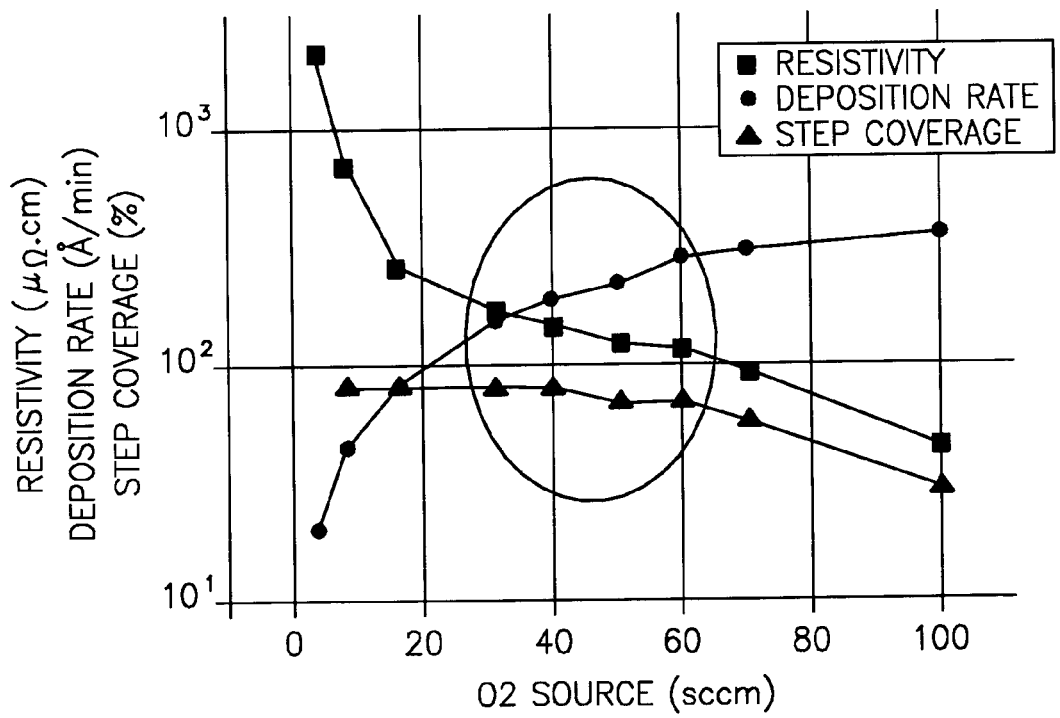
FIG. 10 is a graph showing variation in each of resistivity, deposition rate, and step coverage with oxygen flow rate using a ruthenium source according to the present invention.

Under the same variable values as mentioned above, resistivity as a function of pressure was measured while varying the ruthenium source flow rate and the oxygen flow rate. As shown in FIG. 9, pressure only slightly affects resistivity.

Therefore, it can be said that temperature and pressure have minimal effects on the physical properties of ruthenium sources according to the present invention. However, with reference to the deposition temperature, ruthenium sources according to the present invention, such as the bis norbornadiene ruthenium, spontaneously decompose and react with other compounds at a temperature range of 250–500° C. Therefore, preferably, the film deposition is carried out at 250–500° C.

Next, resistivity, deposition rate and step coverage were measured while varying the oxygen flow rate and keeping the flow rate of the ruthenium source constant. Oxygen was supplied over the range of 0–100 sccm, and the ruthenium source was supplied at a constant rate of 1 ccm. The deposition temperature was 350° C. and the deposition pressure was 1 Torr. In the case of depositing the ruthenium film under the conditions mentioned above, as the oxygen flow rate was increased, resistivity was remarkably decreased, but the deposition rate (deposition speed) was increased. Step coverage was gradually decreased after the oxygen flow rate exceeded 60 sccm.

FIGS. 11 to 13 show scanning electron microscope (SEM) photographs of ruthenium films of the present invention.

Figure 11A:
FIGS. 11A, 11B and 11C are photographs of ruthenium films formed at an oxygen flow rate of 16 sccm using a ruthenium source according to the present invention; (A) a ruthenium film after deposition, (B) a ruthenium film that was annealed at 450° C. under a hydrogen atmosphere for 30 minutes after deposition, and (C) a ruthenium film that was annealed at 700° C. under a nitrogen atmosphere for 30 minutes after deposition.
Figure 11B:
Figure 11C:
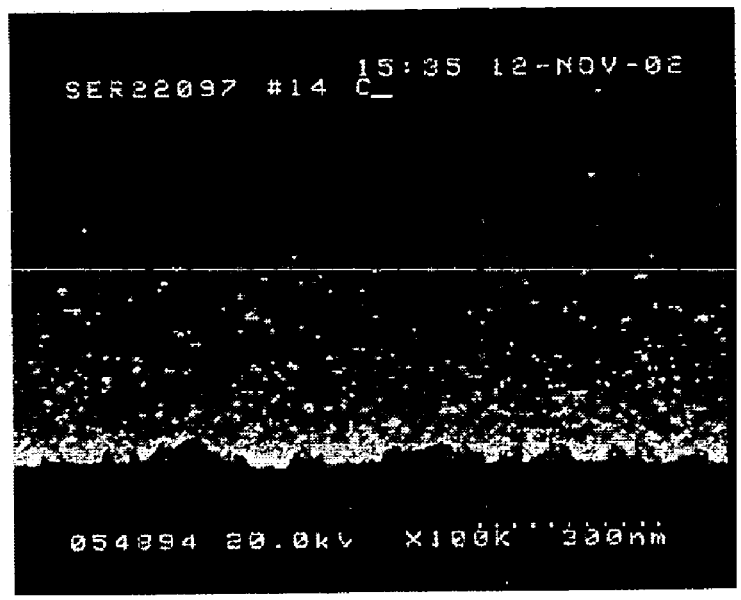

FIGS. 11A, 11B and 11C show images of ruthenium films formed at an oxygen flow rate of 16 sccm using a ruthenium source of the present invention; (A) a ruthenium film after deposition, (B) a ruthenium film that was annealed at 450°

C. under a hydrogen atmosphere for 30 minutes after deposition, and (C) a ruthenium film that was annealed at 700° C. under a nitrogen atmosphere for 30 minutes after deposition.

Figure 12A:
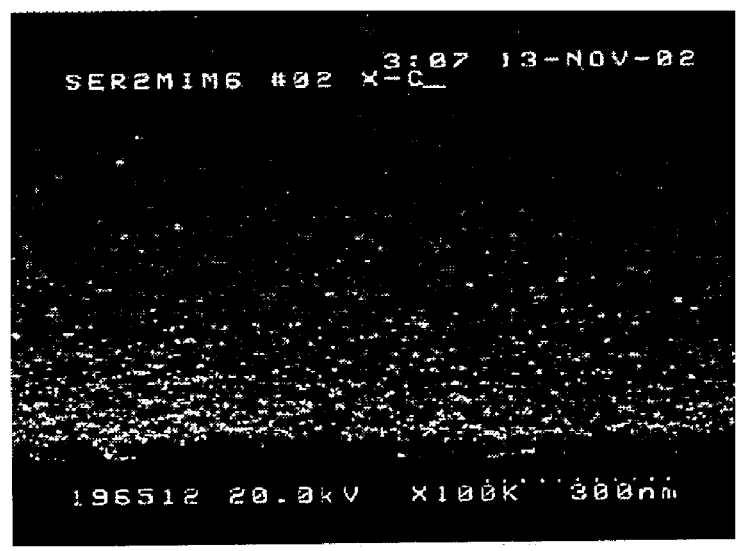
FIGS. 12A, 12B and 12C are photographs of ruthenium films formed at an oxygen flow rate of 40 sccm using a ruthenium source according to the present invention; (A) a ruthenium film after deposition, (B) a ruthenium film that was annealed at 450° C. under a hydrogen atmosphere for 30 minutes after deposition, and (C) a ruthenium film that was annealed at 700° C. under a nitrogen atmosphere for 30 minutes after deposition.
Figure 12B:
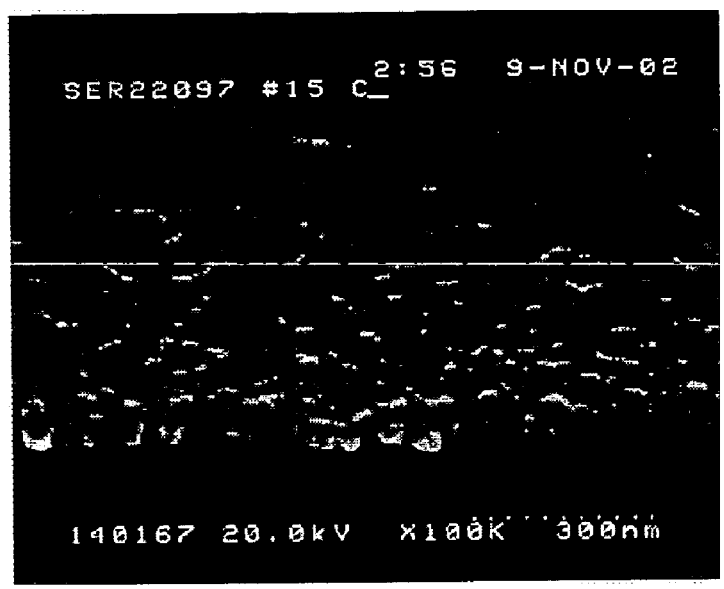
Figure 12C:
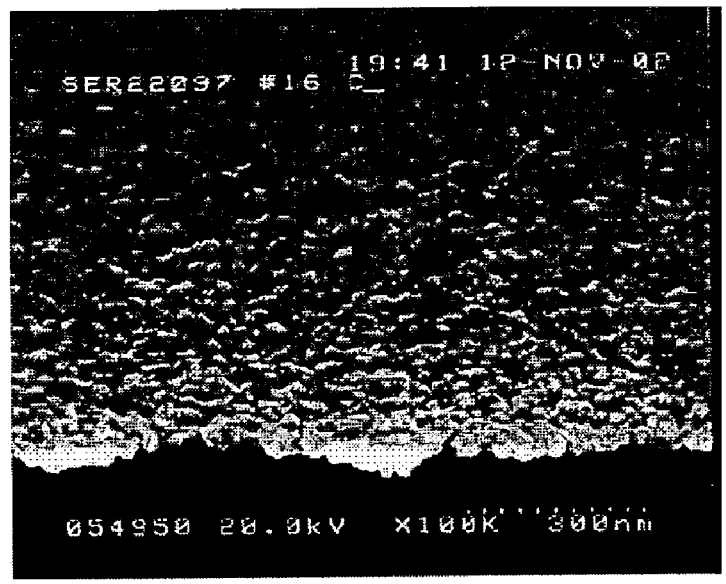

FIGS. 12A, 12B and 12C show images of ruthenium films formed at an oxygen flow rate of 40 sccm using a ruthenium source of the present invention; (A) a ruthenium film after deposition, (B) a ruthenium film that was annealed at 450° C. under a hydrogen atmosphere for 30 minutes after deposition, and (C) a ruthenium film that was annealed at 700° C. under a nitrogen atmosphere for 30 minutes after deposition.

Figure 13A:
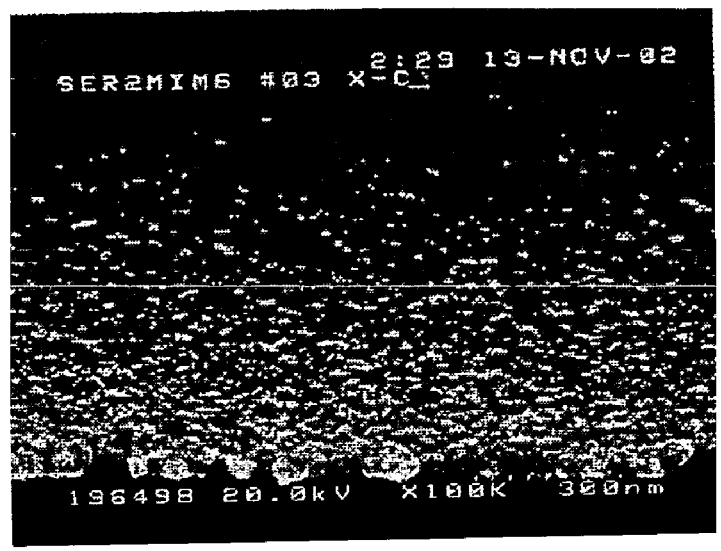
FIGS. 13A, 13B and 13C are photographs of ruthenium films formed at an oxygen flow rate of 70 sccm using a ruthenium source according to the present invention; (A) a ruthenium film after deposition, (B) a ruthenium film that was annealed at 450° C. under a hydrogen atmosphere for 30 minutes after deposition, and (C) a ruthenium film that was annealed at 700° C. under a nitrogen atmosphere for 30 minutes after deposition.
Figure 13B:
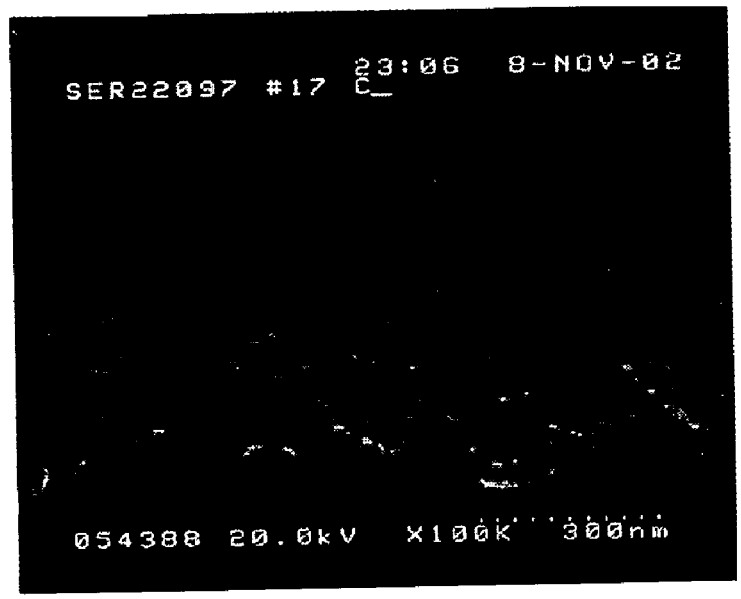
Figure 13C:
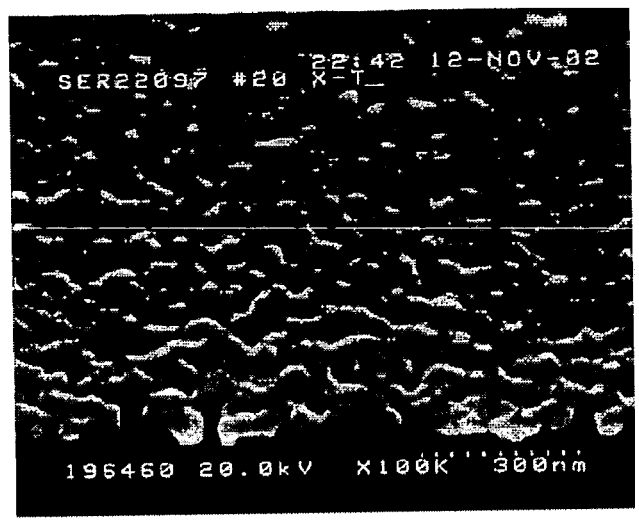

FIGS. 13A, 13B and 13C show images of ruthenium films formed at an oxygen flow rate of 70 sccm using a ruthenium source of the present invention; (A) a ruthenium film after deposition, (B) a ruthenium film that was annealed at 450° C. under a hydrogen atmosphere for 30 minutes after deposition, and (C) a ruthenium film that was annealed at 700° C. under a nitrogen atmosphere for 30 minutes after deposition.

As shown in FIGS. 11 to 13, when a ruthenium film is subjected to annealing at 450° C., the ruthenium source is sufficiently decomposed by the oxygen, resulting in the reduction of impurities in the ruthenium film. In the ruthenium film surfaces from which impurities are removed, grain growth and agglomeration are partially caused. On the other hand, when a ruthenium film is annealed at 700° C., surface areas on which a small amount of oxygen is provided have smooth surfaces. In surface areas on which a large amount of oxygen is provided, excess grain growth and agglomeration result (see FIG. 13C).

As apparent from the above description, in order to form a ruthenium film with optimal resistivity, deposition rate and step coverage, the oxygen flow rate is preferably 20 to 60 sccm.

Figure 14:
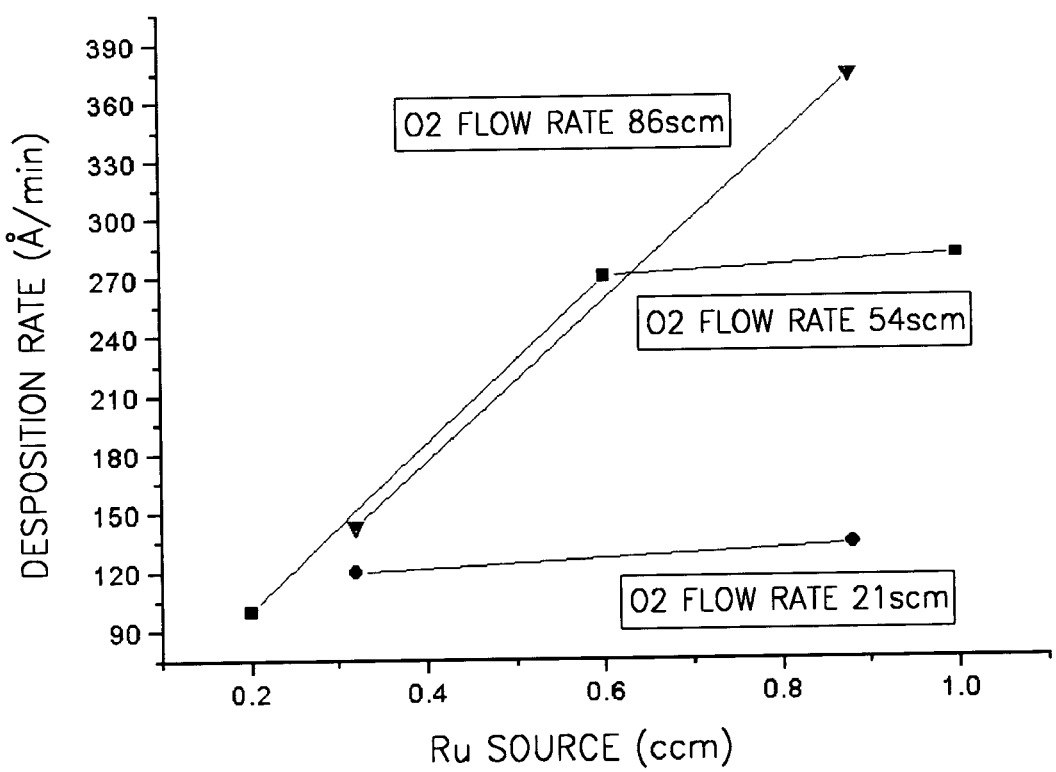
FIG. 14 is a graph showing variation in deposition rate with a flow rate of a ruthenium source according to the present invention.
Figure 15:
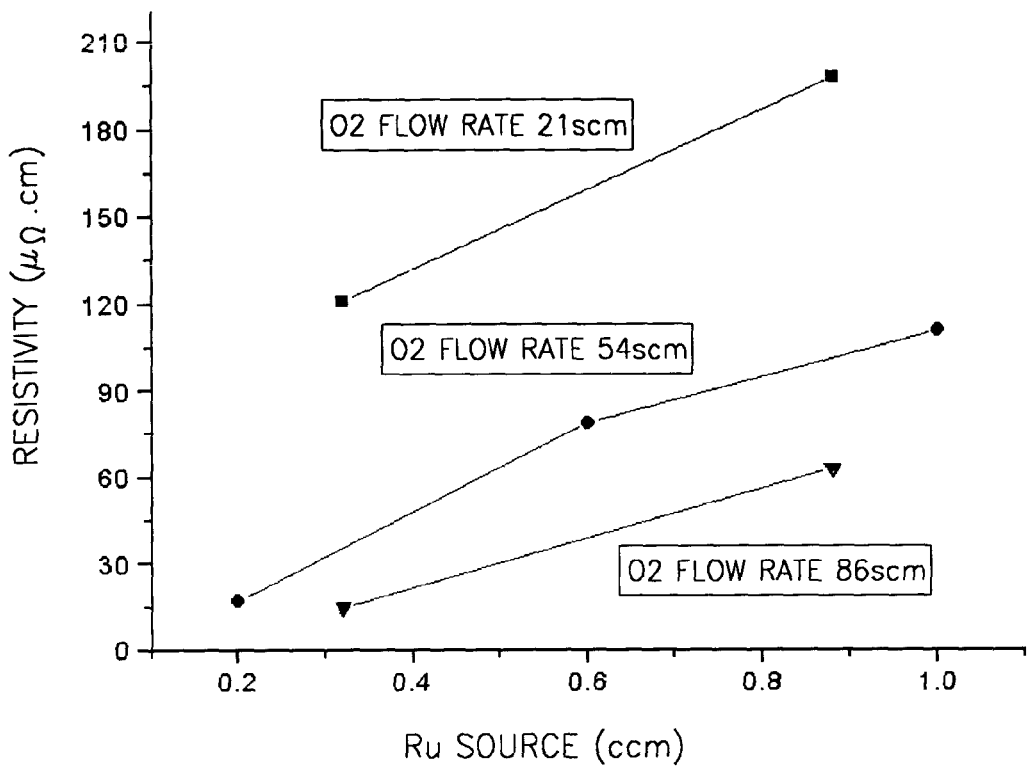
FIG. 15 is a graph showing variation in resistivity with a flow rate of a ruthenium source according to the present invention.

Next, the deposition rate and resistivity as a function of the ruthenium source flow rate according to the present invention will be described. FIG. 14 is a graph showing variation in deposition rate with the flow rate of a ruthenium source of the present invention. As shown in FIG. 14, the deposition rate is increased as the flow rate of a ruthenium source is increased. In particular, as both of the oxygen flow rate and the ruthenium source flow rate are increased, the deposition rate is remarkably increased. Similarly, as the flow rate of a ruthenium source is increased, resistivity is increased (FIG. 15). However, resistivity is decreased as the oxygen flow rate is increased. Therefore, in order to form a ruthenium film with optimal resistivity, deposition rate and step coverage, it is preferable to provide ruthenium sources of the present invention at a flow rate of about 0.2 to 1 ccm, and more preferably at 0.4 to 0.8 ccm.

In summary, the ruthenium film 110 with optimal resistivity, deposition rate, and step coverage according to the present invention can be formed under the following conditions: an oxygen flow rate of 20 to 60 sccm, a ruthenium source flow rate of 0.2 to 1 ccm, a deposition temperature of 200 to 500° C. (and preferably 330 to 430° C.) and a deposition pressure of 0.1 to 30 Torr (and preferably 0.5 to 5 Torr). Decomposition of a ruthenium source is maximized at the aforementioned deposition temperature and pressure range.

Under the aforementioned conditions, the ruthenium seed is uniformly distributed on the surface of an interlayer insulating layer and a high quality ruthenium film 110 is formed without altering the process condition. Furthermore, because the aforementioned two-step CVD process is not used, the process burden is reduced and device reliability is improved. In order to improve process efficiency, an inert gas such as nitrogen and argon may be supplied onto a substrate.

Meanwhile, adhesion of ruthenium films were tested using a ruthenium source of the present invention and the conventional bis(ethylcyclopentadienyl)ruthenium. The adhesion test refers to a "peeling test". For the peeling test, ruthenium films were formed on wafers with a size of 20 cm×20 cm. Each wafer was cut into a total of 1600 grids with specimen sizes of 5 mm×5 mm. Then, cellophane tapes were attached to the specimens. After the cellophane tapes were removed from the specimens, the number of specimens of ruthenium films that were peeled off from wafers was measured. In most specimens of the present invention, ruthenium films were not peeled off from wafers. However, in the conventional ruthenium films, 35 specimens were peeled off from wafers. Based on this test, it can be seen that ruthenium films formed using ruthenium sources of the present invention have superior adhesion to an interlayer insulating layer than those formed using a conventional ruthenium source.

Figure 16:
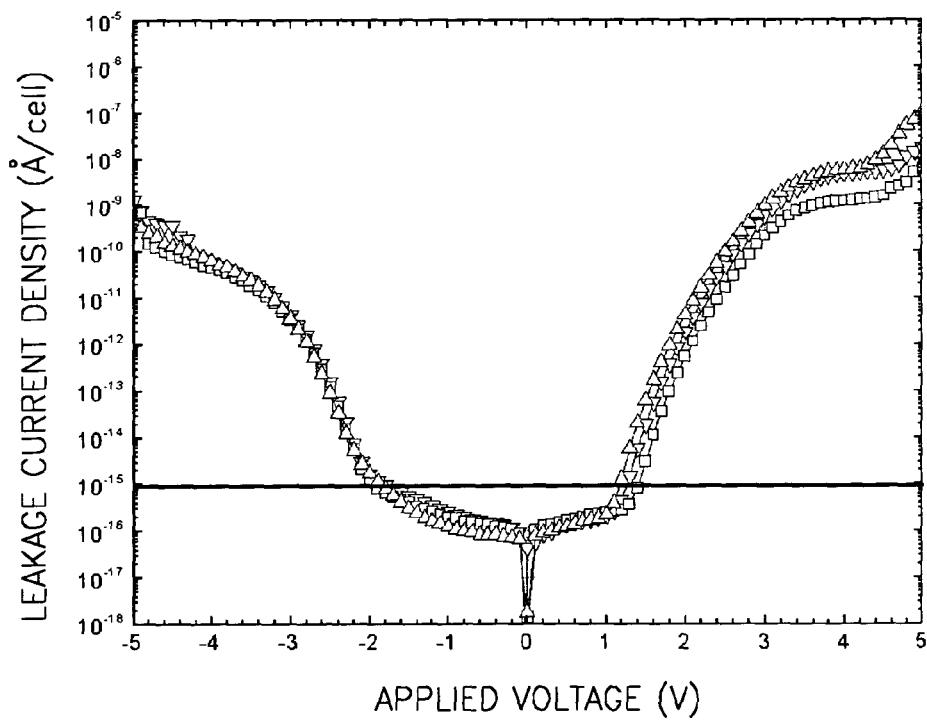
FIG. 16 is a graph showing variation in leakage current density with applied voltage using a ruthenium source according to the present invention.

FIG. 16 is a graph showing the leakage current density of a ruthenium film according to the present invention. It can be seen from FIG. 16 that ruthenium films of the present invention exhibit stable leakage current.

Hereinafter, a method for manufacturing an MIM capacitor using the aforementioned ruthenium film forming method will be described in detail.

Figure 17A:
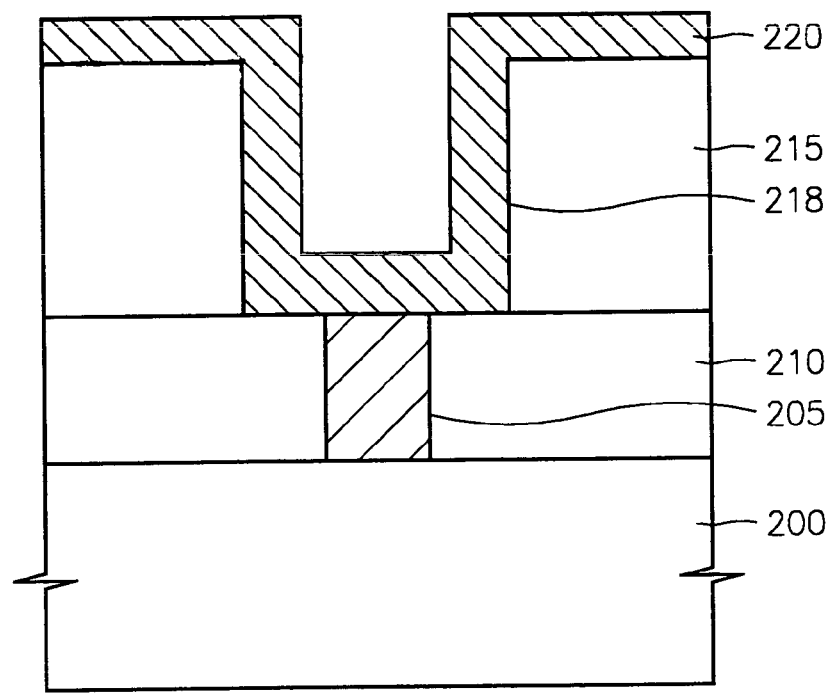
FIGS. 17A and 17B are cross sectional views of a semiconductor substrate in successive steps in a method for manufacturing a metal-insulator-metal (MIM) capacitor according to the present invention.

Reference is made to FIG. 17A, an interlayer insulating layer 210 in which a storage node plug 205 is contained is formed on a semiconductor substrate 200. A mold oxide layer 215 is deposited on the interlayer insulating layer 210. An etch stopper (not shown) may be placed between the interlayer insulating layer 210 and the mold oxide layer 215.

Then, the mold oxide layer 215 is etched to expose the storage node plug 205, thereby forming a lower electrode area 218. A first ruthenium film 220 is formed on the mold oxide layer 215 and the lower electrode area 218. The first ruthenium film is preferably formed by a method comprising supplying a ruthenium source at a flow rate of 0.2–1 ccm and oxygen at a flow rate of 8–100 sccm and preferably 20–60 sccm onto a substrate and depositing the ruthenium film at a temperature of 330–430° C. under a pressure of 0.5–5 Torr using CVD. The ruthenium source is a two β-diketones-coordinated ruthenium complex such as bis norbornadiene ruthenium. In the case of using such a ruthenium source under the aforementioned single process condition, a ruthenium film of uniform thickness can be formed.

Figure 17B:
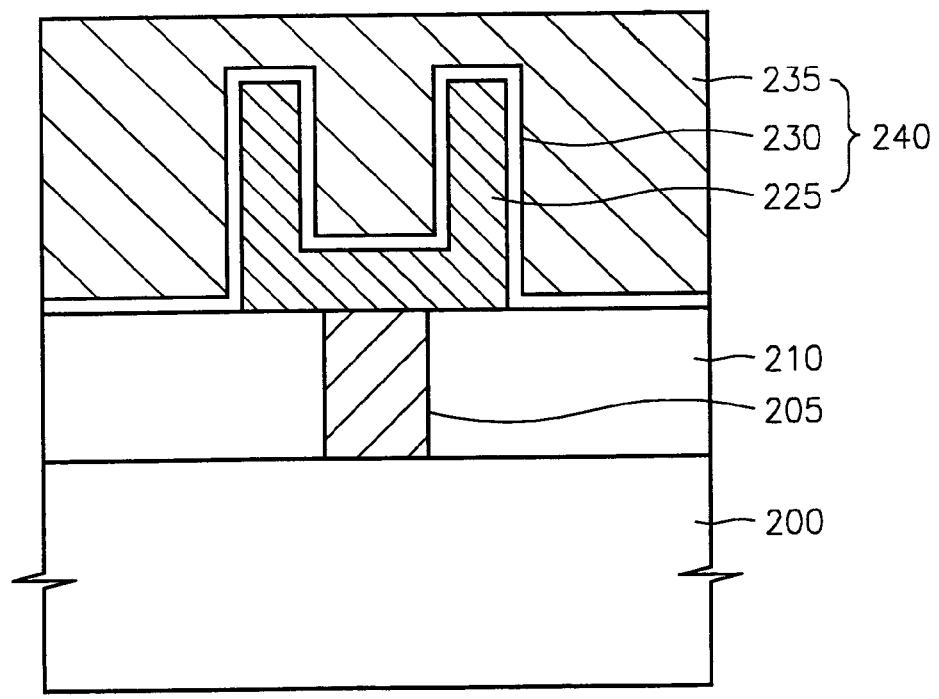

Reference is now made to FIG. 17B. In FIG. 17B, the ruthenium film 220 (from FIG. 17A) was subjected to chemical and mechanical polishing (CMP) to expose the mold oxide layer 215, resulting in formation of a lower electrode 225. Before the CMP process, a buffer oxide layer may be formed on the first ruthenium film 220. Then, the mold oxide layer 215 is removed in a conventional manner. Then, a dielectric layer 230, for example tantalum oxide layer ($Ta_2O_5$) is formed on the lower electrode 225 and the interlayer insulating layer 210. A second ruthenium film is formed on the dielectric layer 230 in the same manner as when forming the first ruthenium film 220 to thereby form an upper electrode 235. As a result, capacitor 240 is produced.

Therefore, in case of manufacturing an MIM capacitor using the ruthenium film forming method of the present invention, a process step is simplified and excellent ruthenium electrodes can be obtained.

As apparent from the above description, according to the ruthenium film forming method of the present invention, a ruthenium source is a two β-diketone-coordinated ruthenium complex such as bis norbornadiene ruthenium. An oxygen flow rate, temperature, and pressure are optimally adjusted. Therefore, a ruthenium film which has excellent resistivity, deposition rate and step coverage is formed.

In addition, homogeneous nucleation occurs and a ruthenium film with uniform thickness is formed.

Furthermore, because a ruthenium film is formed under a single process condition, the process is simplified. As a result, process reproducibility and device reliability are improved. In addition, because a vacuum is not generated during the formation of the ruthenium film due to the constant pressure, a ruthenium film with uniform thickness is formed.

Still furthermore, ruthenium films formed using ruthenium sources of the present invention have excellent adhesion to an interlayer insulating layer. As a result, the leakage current that results from the peeling of a ruthenium film from an interlayer insulating layer is prevented.

While the present invention has been particularly shown and described with reference to exemplary embodiments thereof, it will be understood by those of ordinary skill in the art that various changes in form and details may be made therein without departing from the spirit and s cope of the present invention as defined by the following claims.

What is claimed is:

1. A method for forming a ruthenium film, the method comprising supplying a two β-diketones-coordinated ruthenium complex as a ruthenium source and oxygen onto a substrate and depositing the ruthenium film using chemical vapor deposition (CVD), wherein the ruthenium source is a two β-diketones and one diene-coordinated ruthenium complex as represented by the formula 1:

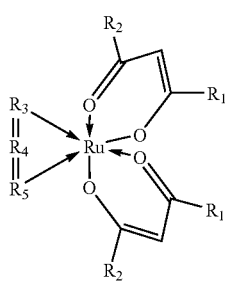

(1)

wherein $R_1$ and $R_2$ are alkyl groups; the total carbon number of $R_1$ and $R_2$ is 3 to 5; and $R_3$, $R_4$ and $R_5$ are interconnected to each other to form a chain.

2. The method according to claim 1, wherein the diene is 1,4-cyclohexadiene, norbornadiene, or 1,5-cyclooctadiene.

3. The method according to claim 1, wherein $R_1$ and $R_2$ are asymmetric.

4. A method for forming a ruthenium film, the method comprising supplying a two β-diketones-coordinated ruthenium complex as a ruthenium source and oxygen onto a substrate and depositing the ruthenium film using chemical vapor deposition (CVD), wherein the ruthenium source is a two β-diketones and one diamine-coordinated ruthenium complex as represented by the formula 2:

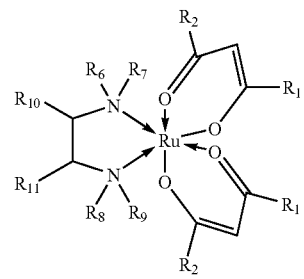

(2)

wherein $R_1$ and $R_2$ are alkyl groups; the total carbon number of $R_1$ and $R_2$ is 2 to 5; $R_6$, $R_7$, $R_8$, $R_9$, $R_{10}$ and $R_{11}$ are independently hydrogen or alkyl groups; and the total carbon number of $R_6$, $R_7$, $R_8$, $R_9$, $R_{10}$ and $R_{11}$ is 2 to 8.

5. The method according to claim 4, wherein the diamine is N,N,N',N'-tetramethylethylenediamine.

6. The method according to claim 4, wherein $R_1$ and $R_2$ are asymmetric.

7. A method for forming a ruthenium film, the method comprising supplying a two β-diketones-coordinated ruthenium complex as a ruthenium source and oxygen onto a substrate and depositing the ruthenium film using chemical vapor deposition (CVD), wherein the ruthenium source is a two β-diketones and two organic ligands-coordinated ruthenium complex as represented by the formula 3:

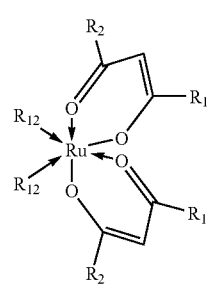

(3)

wherein $R_1$ and $R_2$ are alkyl groups; the total carbon number of $R_1$ and $R_2$ is 2 to 5; and two $R_{12}$ groups are olefin, amine, nitrile or carbonyl.

8. The method according to claim 7, wherein the olefin is ethylene, propylene, 2-methylpropylene, butyl, or 1,3-butadiene.

9. The method according to claim 8, wherein the amine is trimethylamine or triethylamine.

10. The method according to claim 9, wherein the nitirile is acetonitrile or acrylonitrile.

11. The method according to claim 7, wherein the two β-diketones are 2,4-hexanedione, 5-methyl-2,4-hexanedione, 2,4-heptanedione, 5-methyl-2,4-heptanedione, 6-methyl-2,4-heptanedione, or 2,4-octanedione.

12. A method for forming a ruthenium film, the method comprising supplying a two β-diketones-coordinated ruthenium complex as a ruthenium source and oxygen onto a substrate and depositing the ruthenium film using chemical vapor deposition (CVD), wherein the ruthenium source is bis(isoheptane-2,4-dionato)norbornadiene ruthenium (Ru $(C_7H_8)(C_7H_{11}O_2)_2$).

13. A method for forming a ruthenium film, the method comprising supplying a two β-diketones-coordinated ruthenium complex as a ruthenium source at a flow rate of 0.2–1 ccm and oxygen at a flow rate of 20–60 sccm, and depositing the ruthenium film using CVD, wherein the ruthenium source is a two β-diketones and one diamine-coordinated ruthenium complex as represented by the formula 1:

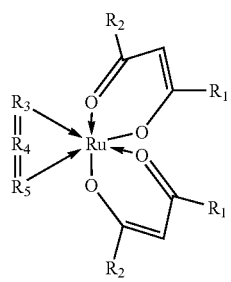

(1)

wherein $R_1$ and $R_2$ are alkyl groups; the total carbon number of $R_1$ and $R_2$ is 3 to 5; and $R_3$, $R_4$ and $R_5$ are interconnected to each other to form a chain.

14. The method according to claim 13, wherein the diene is 1,4-cyclohexadiene, norbornadiene, or 1,5-cyclooctadiene.

15. The method according to claim 13, wherein $R_1$ and $R_2$ are asymmetric.

16. A method for forming a ruthenium film, the method comprising supplying a two β-diketones-coordinated ruthenium complex as a ruthenium source at a flow rate of 0.2–1 ccm and oxygen at a flow rate of 20–60 sccm, and depositing the ruthenium film using CVD, wherein the ruthenium source is a two β-diketones and one diamine-coordinated ruthenium complex as represented by the formula 2:

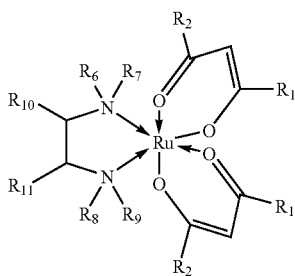

(2)

wherein, $R_1$ and $R_2$ are alkyl groups; the total carbon number of $R_1$ and $R_2$ is 2 to 5; $R_6$, $R_7$, $R_8$, $R_9$, $R_{10}$ and $R_{11}$ are independently hydrogen or alkyl groups; and the total carbon number of $R_6$, $R_7$, $R_8$, $R_9$, $R_{10}$ and $R_{11}$ is 2 to 8.

17. The method according to claim 16, wherein the diamine is N,N,N',N'-tetramethylethylenediamine.

18. The method according to claim 16, wherein $R_1$ and $R_2$ are asymmetric.

19. A method for forming a ruthenium film, the method comprising supplying a two β-diketones-coordinated ruthenium complex as a ruthenium source at a flow rate of 0.2–1 ccm and oxygen at a flow rate of 20–60 sccm, and depositing the ruthenium film using CVD, wherein the ruthenium source is a two β-diketones and two organic ligands-coordinated ruthenium complex as represented by the formula 3:

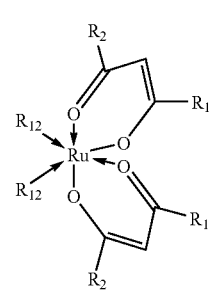

(3)

wherein $R_1$ and $R_2$ are alkyl groups; the total carbon number of $R_1$ and $R_2$ is 2 to 5; and two $R_{12}$ groups are olefin, amine, nitrile or carbonyl.

20. The method according to claim 19, wherein the olefin is ethylene, propylene, 2-methylpropylene, butyl, or 1,3-butadiene.

21. The method according to claim 20, wherein the amine is trimethylamine or triethylamine.

22. The method according to claim 21, wherein the nitirile is acetonitrile or acrylonitrile.

23. The method according to claim 19, wherein the two β-diketones are 2,4-hexanedione, 5-methyl-2,4-hexanedione, 2,4-heptanedione, 5-methyl-2,4-heptanedione, 6-methyl-2,4-heptanedione, or 2,4-octanedione.

24. A method for forming a ruthenium film, the method comprising supplying a two β-diketones-coordinated ruthenium complex as a ruthenium source at a flow rate of 0.2–1 ccm and oxygen at a flow rate of 20–60 sccm, and depositing the ruthenium film using CVD, wherein the ruthenium source is bis(isoheptane-2,4-dionato)norbornadiene ruthenium.

25. A method for forming a ruthenium film, the method comprising supplying bis(isoheptane-2,4-dionato)norbornadiene ruthenium at a flow rate of 0.2–1 ccm and oxygen at a flow rate of 20–60 sccm and depositing the ruthenium film at a temperature of 330–430° C. under a pressure of 0.5–5 Torr using CVD.

26. The method according to claim 25, wherein the depositing of the ruthenium film includes supplying an inert gas, including nitrogen and argon, onto the substrate.

* * * * *

UNITED STATES PATENT AND TRADEMARK OFFICE
CERTIFICATE OF CORRECTION

| | | |
|---|---|---|
| PATENT NO. | : 7,049,232 B2 | Page 1 of 1 |
| APPLICATION NO. | : 10/657596 | |
| DATED | : May 23, 2006 | |
| INVENTOR(S) | : Lee et al. | |

It is certified that error appears in the above-identified patent and that said Letters Patent is hereby corrected as shown below:

Column 11,
Line 6 should read -- source is a two β-diketones and one diene-coordinated --

Signed and Sealed this

Seventh Day of November, 2006

JON W. DUDAS
*Director of the United States Patent and Trademark Office*